United States Patent [19]

Miyazaki et al.

[11] Patent Number: 5,661,729
[45] Date of Patent: Aug. 26, 1997

[54] SEMICONDUCTOR MEMORY HAVING BUILT-IN SELF-TEST CIRCUIT

[75] Inventors: Jyunzo Miyazaki; Junji Hashimoto, both of Nagasaki, Japan

[73] Assignee: Sony Corporation, Japan

[21] Appl. No.: 636,524

[22] Filed: Apr. 23, 1996

[30] Foreign Application Priority Data

Apr. 28, 1995 [JP] Japan .................. 7-127398
May 31, 1995 [JP] Japan .................. 7-155507

[51] Int. Cl.$^6$ .................................................. G06F 11/00
[52] U.S. Cl. .................................... 371/21.2; 365/201
[58] Field of Search ........................ 371/21.2, 21.4, 371/21.6, 24; 365/201

[56] References Cited

U.S. PATENT DOCUMENTS 4,752,929  6/1988  Kantz et al. .................. 371/21.2
4,768,194  8/1988  Fuchs .......................... 371/21.2

Primary Examiner—Vincent P. Canney
Attorney, Agent, or Firm—Ronald P. Kananen

[57] ABSTRACT

A test pattern generation circuit is stored in a semiconductor memory, a writing operation is carried out with an address sequence pattern and a test data pattern generated with a clock signal obtained from an external part during a test mode, the test data pattern and the read-out data are compared from each other during a reading-out operation, a pass or non-pass discrimination signal in the memory is attained in response to whether both of them are coincided with each other or not, the pass or non-pass discrimination signal is outputted to an external terminal, the number of test signal driving signals is reduced and the number of parallel test chips is increased so as to reduce a test cost. In addition, the memory has a power supply shut-off control circuit and a stable test is carried out by shutting-off the power supply in the case that the power supply shows a short-circuited state.

4 Claims, 4 Drawing Sheets

F I G. 2
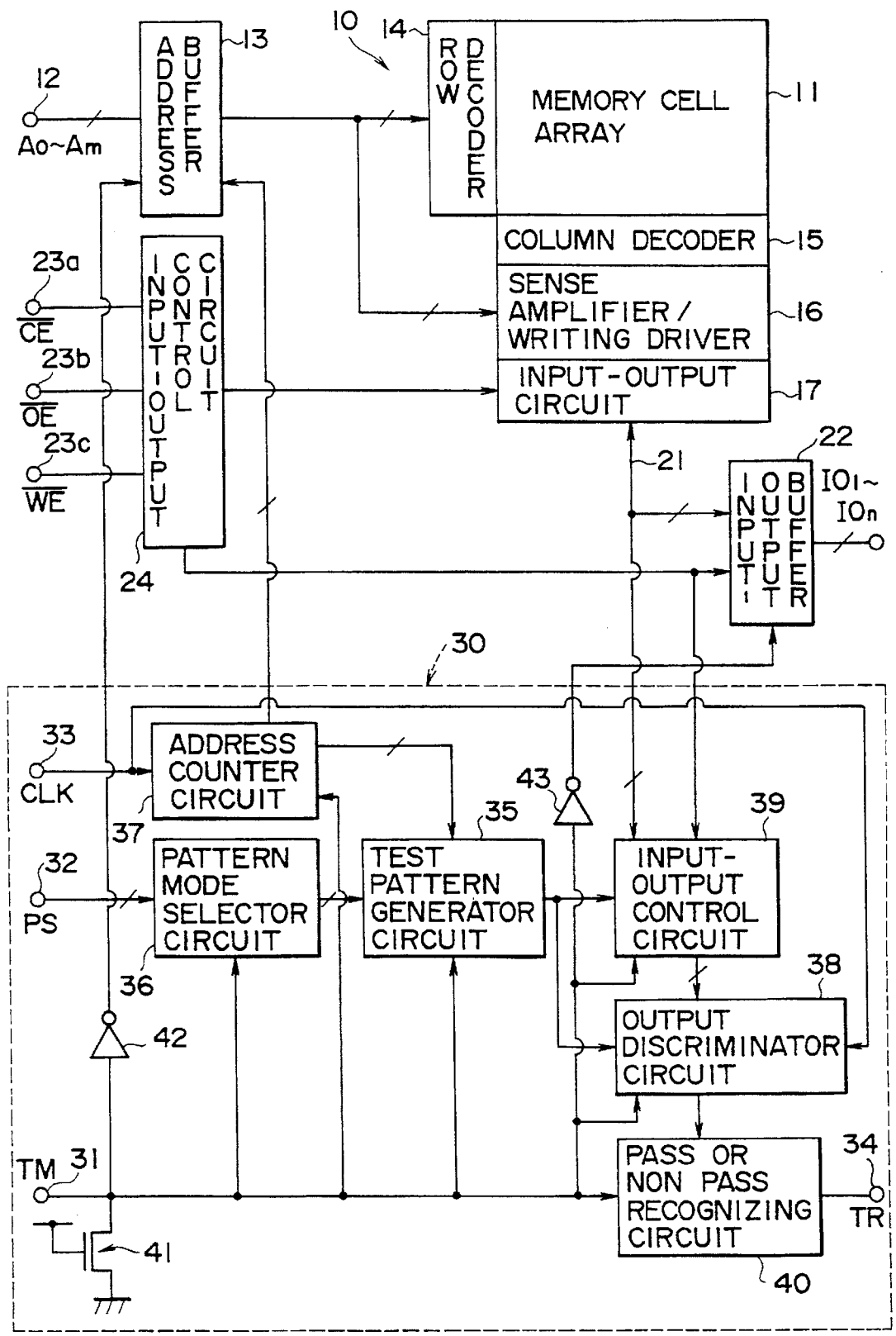

1

SEMICONDUCTOR MEMORY HAVING BUILT-IN SELF-TEST CIRCUIT

FIELD OF THE INVENTION

This invention relates to a semiconductor memory having a test function circuit built in a memory chip, and more particularly to a semiconductor memory having a circuit for increasing the number of concurrent measurements of chips under a wafer state or excluding poor chips within a wafer from an electrical measuring target.

BACKGROUND OF THE INVENTION

In the prior art, a pellet check for a semiconductor memory under a wafer state was carried out with a memory tester by performing a writing and a reading-out of data in respect to each of the chips on the wafer in the same manner as that of the actual operation. In this pellet checking operation, more practically, each of the probes of the probe card connected to the memory tester was at first contacted with a terminal of its corresponding semiconductor memory, a predetermined address signal was given to the address input memory of the semiconductor memory, a control signal was applied to the control signal input terminal of the semiconductor memory, the data from the driver of the memory tester was applied to the input-output terminal of the semiconductor memory so as to write data into the memory cell of the semiconductor memory. Then, the data was read out, a potential at the input-output terminal of the semiconductor memory was compared with a reference voltage by a comparator in the memory tester, thereby the output data in the semiconductor memory was reproduced, it was discriminated whether or not the written data and the read-out data are coincided to each other for every input-output terminal of the semiconductor memory and further it was discriminated whether or not the writing and the reading-out were normal or not.

In turn, in the memory tester, the number of drivers and comparators are set in response to its type and the number of concurrent measurements of chips in the pellet check is widely influenced by the number of terminals in the semiconductor memory. In the pellet check of the prior art semiconductor memory, there was a problem that as the number of terminals in the semiconductor memory is increased, the number of concurrent measurements was decreased and a measuring cost was expensive. In addition, since a number of drivers and comparators were needed in the memory tester, it was also difficult to perform a wafer burn-in test for performing a burn-in test for all the chips in the wafer under its wafer state.

In addition, referring now to FIG. 1 showing an example of configuration of SRAM (Static Random Access Memory), a power supply is supplied in parallel to the memory cell array 101 and the peripheral circuit 102 through the power supply pad 103 and the ground pad 104. It is sometimes found that the current supply part is provided with a down-converter and an up-converter (a power supply voltage-drop circuit and a power supply increasing circuit) and the like and in this case, they are installed among the power supply pad 103, the memory cell array 101 and the peripheral circuit 102.

In the case that a number of semiconductor chips are measured in parallel to each other, current is supplied concurrently from the memory tester to many chips within the same wafer. At this time, if there is a chip having a power supply terminal and a ground terminal short-circuited from each other in the wafer, an excessive load is applied to the current supply part of the tester and a stable measurement is prohibited. In particular, there occurs a problem in the case that many chips in the same wafer are concurrently tested for wafer burn-in test. In order to avoid this problem, it is necessary to arrange many relays at a current supply part when an accommodation is set at the tester for shutting off the power supply in the failure chip and this becomes a cause of increasing cost for the tester.

SUMMARY OF THE INVENTION

A semiconductor memory of the present invention is comprised of a memory cell array having a plurality of memory cells for storing data; input-output means for inputting or outputting data; test data generation means for generating a predetermined data during a testing operation; a writing and reading-out control means for performing a writing of data inputted by the input-output means into a memory cell or reading-out data from the memory cell during a normal state and for performing writing of test data generated by the test data generation means or reading-out data from the memory cell during a testing operation; address generation means for generating address of the memory cell in response to a clock signal obtained from an external part during the testing operation; address specifying means for specifying an address of the memory cell for performing a data writing or data reading-out operation by the writing and reading-out control means in response to the address signal from an external part during a normal state, and for specifying an address of the memory cell for writing or reading-out the data by the writing and reading-out control means in response to the address generated by the address generation means during the testing operation; discriminator means for comparing the test data generated by the test data generation means with data read out of the memory cell having the test data written into it during the testing operation, discriminating whether or not the writing and the reading-out are normal and outputting a discrimination result to an external part; and a test operation selecting means for operating the test data generation means, the address generation means and the discriminating means in response to a control signal obtained from an external part during the testing operation.

Secondly, there are provided a memory cell array having a plurality of memory cells for storing data of a unit of a plurality of bits; input-output means for inputting or outputting data of a unit of a plurality of bits; test data generation means capable of generating a plurality of patterns of test data of a plurality of bits during a testing operation; pattern selection means for selecting the test data pattern generated by the test data generation means in response to a pattern selection signal obtained from an external part during a testing operation; a writing and reading-out control means for performing a writing of data inputted by said input-output means into a memory cell or reading-out data from the memory cell during a normal state and for performing writing of test data generated by the test data generation means or reading-out data from the memory cell during a testing operation; address generation means for generating an address of the memory cell in response to a clock signal obtained from an external part during the testing operation; address specifying means for specifying an address of the memory cell for performing a data writing or data reading-out operation by the writing and reading-out control means in response to the address signal from an external part during a normal state, and for specifying an address of the memory cell for writing or reading-out the data by the writing and reading-out control means in response to the address generated by the address generation means during the testing operation; discriminator means for comparing the test data generated by the test data generation means with data read out of the memory cell having the test data written into it during the testing operation, discriminating whether or not the writing and the reading-out are normal and outputting a discrimination result to an external part; and a test operation selecting means for operating the test data generation means, the pattern selecting means, the address generation means and the discriminating means in response to a control signal obtained from an external part during the testing operation.

With the configuration described above, during the testing operation, the test data generation means, the address generation means and the discriminator means are set to be operated by the test operation selection means in response to the control signal obtained from an external part. During this testing operation, a predetermined test data is generated by the test data generation means, an address is generated by the address generation means in response to a clock signal obtained from an external part, the test data is written by the writing and reading-out control means in respect to the memory cell of the address and then the written data is read out. Then, the test data generated by the test data generation means is compared with the data read out of the memory cell having the test data written in it by the discriminator means, it is discriminated whether or not the writing and the reading-out are normal and then the discrimination result is outputted to the external part.

In addition, the semiconductor memory of the present invention is operated such that when the testing operation is carried out, the test data generation means, the pattern selection means, the address generation means and the discriminating means are set to be operated by the test operation selecting means in response to the control signal obtained from the external part. During this testing operation, the test data pattern generated by the test data generation means is selected by the pattern selection means in response to the pattern selection signal obtained from the external part, a test data of a plurality of bits is generated by the test data generation means, an address is generated by the address generating means in response to the clock signal obtained from the external part, the test data is written by the writing and reading-out control means and the written data is read out. Then, the test data generated by the test data generation means is compared with the data read out of the memory cell having the test data written in it by the discriminator means, it is discriminated whether or not the writing and reading-out operations are normal and the discrimination result is outputted to the external part.

Thirdly, the semiconductor memory of the present invention is comprised of a function circuit part having a predetermined function, a terminal for supplying a current to the function circuit, and a conduction or a shut-off selection means capable of selecting the conduction and the shut-off of the current supplied to the function circuit through the terminal.

In addition, the conduction and shut-off selection means has an input terminal for inputting a signal from the external part, and the conduction and the shut-off are selected in response to the signal inputted from the input terminal.

With the configuration described above, both conduction and shut-off of current supplied to the function circuit can be selected by the conduction and shut-off selection means, the selection of the shut-off of the current enables a specified failure chip to be removed electrically from an object to be measured in the case that a concurrent electrical measurement is carried out for a plurality of chips within the same wafer.

Further, the conduction and shut-off selection means may select the conduction and the shut-off in response to the signal obtained from the external part. In this way, it is possible to remove electrically the specified failure chip from the object to be measured under a control of the external measurement device and the like.

BRIEF DESCRIPTION OF THE DRAWINGS

FIG. 2 is a block diagram for illustrating a configuration of a semiconductor memory of one preferred embodiment of the present invention.

DETAILED DESCRIPTION OF THE PREFERRED EMBODIMENTS

Figure 1:
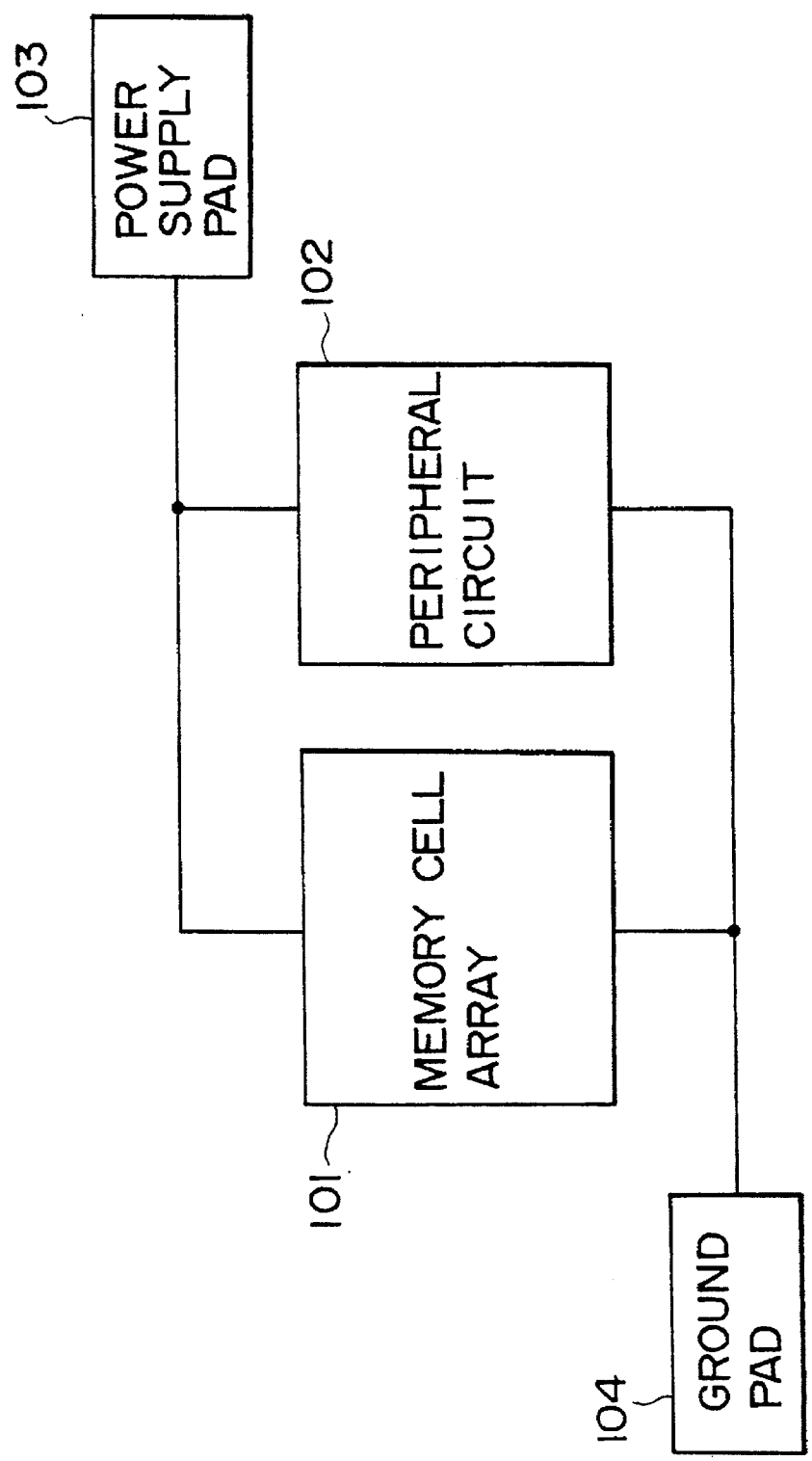
FIG. 1 is a view for illustrating one example of a configuration of a semiconductor memory.

Referring now to the drawings, the preferred embodiments of the present invention will be described in detail as follows.

FIG. 2 is a block diagram for showing a configuration of a semiconductor memory of one preferred embodiment of the present invention. The semiconductor memory 10 of the preferred embodiment of the present invention is a semiconductor memory having a configuration of a plurality of bits for performing a writing and a reading of data in a unit of a plurality of bits, wherein it is comprised of a memory cell array 11 having a plurality of memory cells of which addresses are determined in a unit of a plurality of bits; an address input terminal 12; an address buffer 13 for latching address signals $A_o$ to $A_m$ inputted from this address input terminal 12; a row decoder 14 for decoding row addresses based on the address signals $A_o$ to $A_m$ latched by the address buffer 13 and selecting a word line in the memory cell array 11; a column decoder 15 for decoding column addresses based on the address signals $A_o$ to $A_m$ latched by the address buffer 13 and selecting a bit line in the memory cell array 11; a sense amplifier for amplifying data on the bit line and a write driver for writing data (hereinafter called as a sense amplifier/write driver) 16; and an input-output circuit 17 for controlling an inputting/outputting of data in respect to the memory cell array 11.

The semiconductor 10 is further comprised of a data bus 21 connected to an input-output circuit 17; input-output terminals $IO_t$ to $IO_n$ for use in inputting or outputting data in a unit of a plurality of bits; an input-output buffer 22 for outputting data inputted from the input-output terminals $IO_t$ to $IO_n$ to the data bus 21 during a writing operation at a normal time and for outputting data on the data bus 21 to the input-output terminals $IO_t$ to $IO_n$ during a reading-out operation at a normal time; control signal input terminals 23a to 23c for use in inputting chip select signal bar CE, an output enable signal bar OE and a write enable signal bar WE; and an input-output control circuit 24 for use in controlling an address buffer 13, an input-output circuit 17, an input-output buffer 22 and an input-output control circuit 39 to be described later on the basis of each of the signals inputted from the control signal input terminals 23a to 23c.

The input-output terminals $IO_l$ to $IO_n$ and the input-output buffer 22 correspond to the input-output means of the present invention, and the address buffer 13, the row decoder 14 and the column decoder 15 correspond to an address specifying means of the present invention.

The semiconductor memory 10 is provided with a test circuit 30 for use in performing a pellet checking operation. This test circuit 30 is comprised of a test mode selecting terminal 31 for inputting a test mode selection signal TM from an external part; a pattern mode selection terminal 32 for use in inputting a pattern mode selection signal PS from an external part; a clock input terminal 33 for use in inputting a clock signal CLK from an external part; and a discrimination result output terminal 34 for use in outputting a discrimination result signal TR. The test circuit 30 is further comprised of a test pattern generation circuit 35 acting as a test data generation means capable of producing a plurality of patterns of test data of a plurality of bits during a testing operation; a pattern mode selection circuit 36 acting as a pattern selection means for selecting a pattern of test data generated by the test pattern generation circuit 35 in response to the pattern selection signal PS of a plurality of bits inputted from the test mode selection terminal 31 during the testing operation; an address counter circuit 37 acting as an address generating means for use in counting up synchronous with the clock signal CLK inputted from the clock input terminal 33 during the testing operation and for producing an address of a memory cell for performing a writing or a reading of test data; an output discriminator circuit 38 for use in discriminating whether or not a writing and a reading are normal by comparing the test data outputted from the test pattern generation circuit 35 with data read out of the memory cell having the test data written into it during the testing operation; an input-output control circuit 39 for outputting the test data outputted from the test pattern generation circuit 35 during the writing operation at the time of testing in response to an output of the input-output control circuit 24 to the data bus 21 and concurrently for outputting data left on the data bus 21 to the output discriminator circuit 38 during the reading operation at the time of testing; and a pass or non-pass recognizing memory circuit 40 for inputting the result of discrimination of the output discriminator circuit 38 and outputting the discrimination result signal TR to the discrimination result output terminal 34. The sense amplifier/writing driver 16, the input/output circuit 17, the input-output control circuit 24 and the input-output control circuit 39 correspond to the writing/reading control means of the present invention and further the output discriminator circuit 38 and the pass or non-pass recognizing memory circuit 40 correspond to the discrimination means in the present invention.

The test circuit 30 is further comprised of a nMOS transistor 41, as a test operation selecting means, having a low current capability, for example, for operating the test pattern generation circuit 35, the pattern mode selection circuit 36, the address counter circuit 37, the output discriminator circuit 38, the input-output control circuit 39 and the pass or non-pass recognizing memory circuit 40 in response to the test mode selection signal TM inputted from the test mode selection terminal 31 during testing operation. The test mode selection terminal 31 is connected to the ground through the source and the drain of the transistor 41. The test mode selection terminal 31 is connected to each of the control terminals of the test pattern generation circuit 35, the pattern mode selection circuit 36, the address counter circuit 37, the output discriminator circuit 38, the input-output control circuit 39 and the pass or non-pass recognizing memory circuit 40, also connected to the control terminal of the address buffer 13 through an inverter 42 and further connected to the control terminal of the input-output buffer 22 through an inverter 43.

Address generated by the address counter 37 is inputted to the address buffer 13 and the test pattern generation circuit 35. The test pattern generation circuit 35 holds data for generating a plurality of patterns such as checker board pattern or striped pattern used as a pattern for test data of a plurality of bits. Selection of this pattern is carried out by the pattern selection circuit 36 in response to the pattern selection signal PS inputted from the test mode selection terminal 31. The test pattern generation circuit 35 may generate a predetermined data (either "1" or "0") for every address and for every bit under a calculation of data corresponding to the pattern selected by the pattern mode selection circuit 36 and an address outputted from the address counter circuit 37 in the held data and output it to the input-output control circuit 39. The input-output control circuit 39 is operated to control the writing of the test data generated by the test pattern generation circuit 35 and the reading-out the data from the memory cell in response to the output of the input-output control circuit 24. The output discriminator circuit 38 is operated to set the test data generated by the test pattern generation circuit 35 as an expected value data, compare data read out of the memory cell by the input-output control circuit 39 synchronous with the clock signal CLK with the expected value, discriminate whether or not the writing operation and the reading-out operation are normal, output "0" if they are normal (pass) and "1" if they are abnormal (fail), to the pass or non-pass recognizing memory circuit 40. The pass or non-pass recognizing memory circuit 40 is operated to continue to output "0" to the discrimination result output terminal 34 as the discrimination result signal TR while "0" is being inputted from the output discriminator circuit 38, and continue to output "1" to the discrimination result output terminal 34 as the discrimination result signal TR after "1" is inputted from the output discriminator circuit 38.

Operation of the semiconductor memory 10 of the preferred embodiment will be described as follows. Under a normal state, the test mode selection terminal 31 is fixed at a ground level ("L" level) by the transistor 41, and the address buffer 13 is operated to latch the address signals $A_o$ to $A_m$ inputted from the address input terminal 12 in response to the output from the inverter 42. The input-output buffer 22 is set to be operated in response to the output from the inverter 43. In addition, the test pattern generation circuit 35, the pattern selection circuit 36, the address counter circuit 37, the output discriminator circuit 38, the input-output control circuit 39 and the pass or non-pass recognizing memory circuit 40 are kept at a standby state. Under this normal state, an address of the memory cell in which the data is read out or written is specified in response to the address signals $A_o$ to $A_m$ inputted from the address input terminal 12 and in turn when the writing operation is carried out, data inputted from the input-output terminals $IO_l$ to $IO_n$ is written into the memory cell of the specified address, and when the reading-out operation is carried out, data is read out of the memory cell of the specified address and outputted to the input-output terminals $IO_l$ to $IO_n$.

During test (pellet checking), a contact needle of a probe card of a memory tester is contacted with the control signal input terminals 23a to 23c, the test mode selection terminal 31, the pattern mode selection terminal 32, the clock input terminal 33 and the discrimination result output terminal 34 of the semiconductor memory 10 of the preferred embodiment of the present invention. The control signal input terminals 23a to 23c are connected to the control signal generating part of the memory tester through the contact needle of the probe card, the test mode selection terminal 31, the pattern mode selection terminal 32 and the clock input terminal 33 are connected to the driver of the memory tester, and the discrimination result output terminal 34 is connected to the comparator of the memory tester.

Under this state, a power supply voltage Vcc ("H" level) is applied to the test mode selection terminal 31 by the memory tester, thereby the test pattern generation circuit 35, the pattern mode selection circuit 36, the address counter circuit 37, the output discrimination circuit 38, the input-output control circuit 39 and the pass or non-pass recognizing memory circuit 40 are set to be operated. In addition, the address buffer 13 is operated to latch the address outputted from the address counter circuit 37 in response to the output of the inverter 42. In addition, the input-output buffer 22 is kept at its stand-by state in response to the output of the inverter 43. In addition, the pattern selection signal PS of a plurality of bits is inputted to the pattern mode selection terminal 32 by the memory tester, and the test data pattern generated by the test pattern generation circuit 35 is selected by the pattern mode selection circuit 36 in response to the pattern selection signal PS.

When the test is operated, the clock signal CLK is inputted to the clock input terminal 33 by the memory tester, the address counter circuit 37 performs a counting-up operation in synchronous with this clock signal CLK and generates an address of the memory cell where the test data is written or read out. This address is latched by the address buffer 13, and the address of the memory cell where the test data is written or read out is specified by the row decoder 14 and the column decoder 15. The test pattern generation circuit 35 may generate a predetermined data (either "1" or "0") for every address and every bit under calculation of data corresponding to the pattern selected by the pattern mode selection circuit 36 of the held data and the address outputted from the address counter circuit 37 and output it to the input-output control circuit 39. In addition, the chip selection signal bar CE, the output enable signal bar OE and the write enable signal bar WE are inputted to the control signal input terminals 23a to 23c by the memory tester, and the input-output control circuit 24 may control the address buffer 13, the input-output control circuit 39 and the input-output circuit 17 in response to these signals. The input-output control circuit 39 may perform the writing of test data generated by the test pattern generation circuit 35 into the memory cell in response to the output of the input-output control circuit 24. Then, the input-output control circuit 39 reads out data from the memory cell of the same address and outputs the read-out data to the output discrimination circuit 38.

The output discriminator circuit 38 is operated to set the test data generated by the test pattern generation circuit 35 as an expected value data, compare data read out of the memory cell by the input-output control circuit 39 in synchronous with the clock signal CLK with the expected value, discriminate whether or not the writing operation and the reading-out operation are normal, output "0" if they are normal (pass) and "1" if they are abnormal (fail), to the pass or non-pass recognizing memory circuit 40. The pass or non-pass recognizing memory circuit 40 is operated to continue to output "0" to the discrimination result output terminal 34 as the discrimination result signal TR while "0" is being inputted from the output discriminator circuit 38, and continue to output "1" to the discrimination result output terminal 34 as the discrimination result signal TR after "1" is inputted from the output discriminator circuit 38. The discrimination result signal TR is inputted to the comparator of the memory tester and it is recognized by the memory tester whether or not the writing and the reading-out are normal for every chip.

As described above, in the preferred embodiment, when the pellet check is performed, the address of the memory cell where the test data writing and the test data reading-out are carried out at the semiconductor memory 10 is generated in response to the clock signal CLK given from an external part and concurrently the test data of a plurality of bits is generated and after the test data is written into the memory cell of each of the addresses, it is read out and it is discriminated whether or not the writing and the reading-out are normal. Accordingly, since it is not necessary for the memory tester to give an address of a plurality of bits to the semiconductor memory or for the memory tester to give test data of a plurality of bits to the semiconductor memory and to input a reading-out data of a plurality of bits from the semiconductor memory, a signal given by the memory tester to the semiconductor memory becomes more simple as compared with that of the prior art and the number of pins of the driver and the comparator in the memory tester required for performing the pellet check of the semiconductor memory can be less. With such an arrangement as above, it becomes possible to increase the number of concurrent measurement in the pellet check and to decrease a measuring cost. In view of this fact, it becomes easy to develop a wafer burn-in test for performing the burn-in test for all the chips in the wafer under its wafer state. In addition, in the present preferred embodiment, since the test data pattern generated by the test pattern generation circuit 35 can be selected in response to the pattern selection signal PS obtained from the external part, it is possible to perform an easy production of test data with a desired pattern.

In addition, in the present preferred embodiment, since the input-output buffer 22 is not used during the pellet checking, tests for the input-output buffer 22 such as an output leakage current test or an output current test or the like can not be performed, although other basic pellet checks such as testing of power supply current, writing and reading-out operation tests or the like are not be prohibited.

The present invention is not limited to the aforesaid preferred embodiment, but the present invention can also be applied to the semiconductor memory with a one bit configuration, for example. Also, in this case, the memory tester is not required to give an address of a plurality of bits to the semiconductor memory, so that the number of pins of the memory tester required for the pellet check of the semiconductor memory can be reduced more as compared with that of the prior art.

Also referring to the drawings, another preferred embodiment of the present invention will be described in detail.

Figure 3:
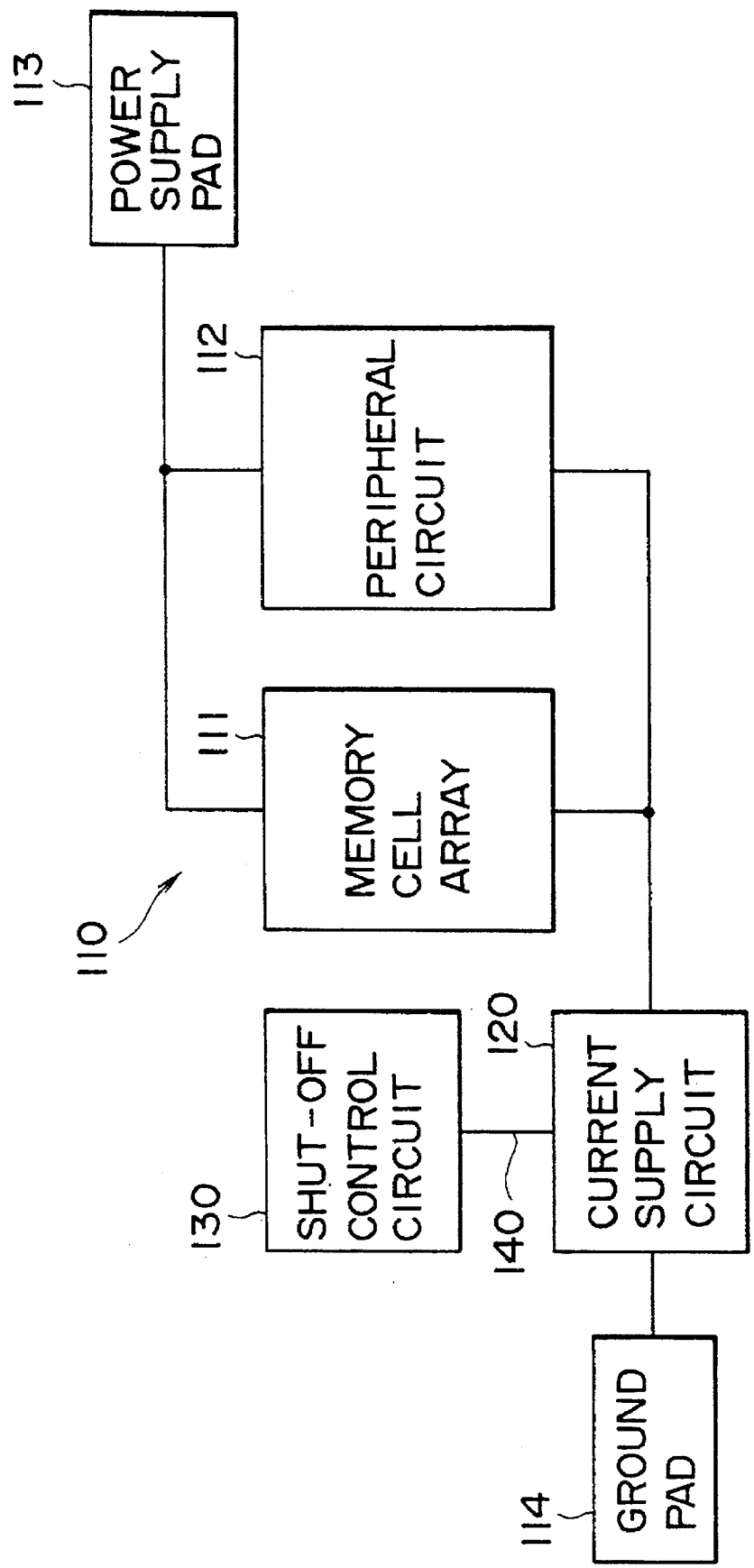
FIG. 3 is a view for illustrating a configuration of a semiconductor memory of another preferred embodiment of the present invention.

FIG. 3 is a block diagram for showing a configuration of the semiconductor memory of one preferred embodiment of the present invention. This semiconductor element 110 is constructed such that an SRAM is formed with an n-type substrate acting as a semiconductor wafer, wherein as its function circuits, there are provided a memory cell array 111 having a plurality of memory cells and a peripheral circuit 112 such as control circuit, address decoder and input-output circuits and the like. The semiconductor element 110 is comprised of a power supply pad 113 and a ground pad 114 acting as terminals for use in supplying electrical current to the memory cell array 111 and the peripheral circuit 112. The memory cell array 111 and the peripheral circuit 112 are directly connected together to the power supply pad 113. In the case that the electrical current supply part has a down-converter circuit or the like, the circuit is placed among the power supply pad 113, the memory cell array 111 and the peripheral circuit 112.

The semiconductor memory 110, acting as an electrical conduction or shut-off selection means, is placed among the memory cell array 111, the peripheral circuit 112 and the ground pad 114, wherein there are provided a current supply circuit 120 capable of selecting conduction and shut-off of current to be supplied to the memory cell array 111 and the peripheral circuit 112, and a shut-off control circuit 130 for controlling the current supply circuit 120. Although the current supply circuit 120 is normally set to be conductive, it is constructed such that a state of shutting off the current can be selected.

As the type of the semiconductor wafer forming the semiconductor element 110, there are an n-type substrate and a p-type substrate, wherein in the case that a concurrent electrical measurement is carried out for a plurality of chips within the same wafer, a power supply is commonly applied for the n-type substrate and the ground is commonly applied for the p-type substrate and so the current is commonly applied to all the chips through substrates. Accordingly, in the case that a concurrent electrical measurement is carried out for a plurality of chips within the same wafer, if the supplying of electrical current for the specified chip is shut off, it is necessary to cut it off at the ground side for the n-type substrate and at the power supply side for the p-type substrate. In the example shown in FIG. 3, the n-type substrate is used as the semiconductor wafer as described above, so that there is provided a current supply circuit 120 at the ground side. In the case that the p-type substrate is used as the semiconductor wafer, the current supply circuit 120 is arranged at the power supply side.

Figure 4:
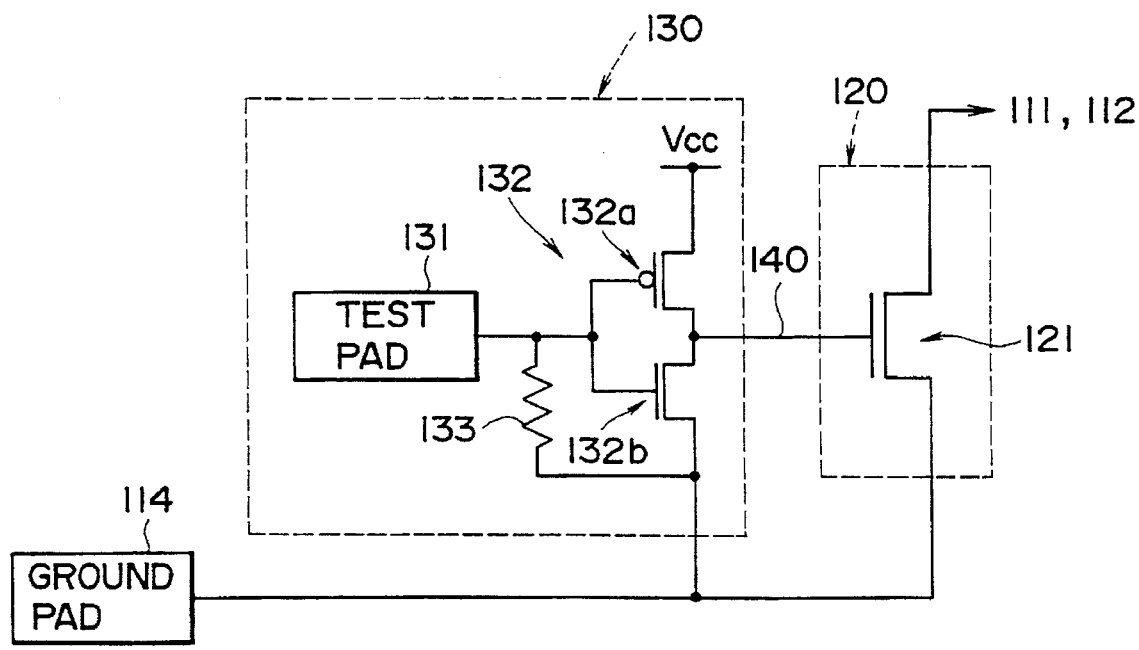
FIG. 4 is a view for illustrating one example of the current supply circuit and the current shut-off control circuit shown in FIG. 3.

FIG. 4 is a circuit diagram for showing one example of a configuration of the current supply circuit 120 and the shut-off control circuit 130 in FIG. 3. In this example, the current supply circuit 120 is comprised of an nMOS (an n-channel MOSFET) having a large size and a high current capability. A drain of this nMOS 121 is connected to the memory cell array 111 and the peripheral circuit 112, and a source of it is connected to a ground pad 114. The shut-off control circuit 130 is comprised of a test pad 131; an inverter 132 of which input end is connected to the test pad 131 and output end is connected to a gate of the nMOS 121; and a resistor 133 having a high resistance value placed between the input end of the inverter 132 and the ground pad 114. The inverter 132 is comprised of a depression type pMOS (p-channel MOSFET) 132a and an enhancement type nMOS 132b. To the source of the nMOS 132a is applied the power supply voltage Vcc. A drain of the pMOS 132a is connected to the drain of the nMOS 132b, and the source of the nMOS 132b is connected to the ground pad 114. The gate of the pMOS 132a and the gate of the nMOS 132b are connected to the test pad 131. One end of the resistor 133 is connected to the gate of the pMOS 132a and the gate of the nMOS 132b, the other end is connected to the ground pad 114. A connecting point between the drain of the pMOS 132a and the drain of the nMOS 132b is connected to the gate of the nMOS 121.

Then, measurement for the semiconductor memory 110 of the preferred embodiment and operation of the semiconductor memory 110 at the time of this measurement will be described later.

A pellet test is carried out for the semiconductor memory 110 of the preferred embodiment under its wafer state. In this pellet test, a concurrent electrical measurement is carried out for many chips within the same wafer. In addition, the pellet test includes a pre-test before performing a survival of poor chip and a post-test after performing the survival of poor chip. The post-test sometimes includes a wafer burn-in test. In the pellet test for the semiconductor element 110 of the preferred embodiment, if a failure chip which can not be recovered is found at the pre-test, the post-test is carried out while the failure chip is removed electrically from an object to be measured.

In the pre-test, a power supply is connected to the power supply pad 113 by a measurement device, the ground pad 114 is connected to the ground and the test pad 131 of the shut-off control circuit 130 is kept open. In this case, since a ground level is applied to the input terminal of the inverter 132 through the resistor 133, a shut-off control signal 140 obtained from the shut-off control circuit 130 becomes "H" level, the current supply circuit 120 becomes conductive and then a current is supplied to the memory cell array 111 and the peripheral circuit 112. In this pre-test, when the chip which can be recovered is found, a recovering process for the failure chip is carried out and then the post-test is performed.

In the case that a failure chip which can not be recovered in the pre-test is found, the power supply voltage Vcc is applied to the test pad 131 in the shut-off control circuit 130 for the failure chip by a measurement device, for example, in order to preform the post-test while the failure chip is electrically removed from the object to be measured. In this way, a shut-off control signal 140 from the shut-off control circuit 130 becomes a "L" level, and the current supply circuit 120 becomes a state for shutting-off the current. Accordingly, in accordance with the semiconductor element 110 of the preferred embodiment, it is possible to perform an easy removal of a specified failure chip within the wafer in an electrical manner in the case that a plurality of chips within the same wafer are electrically measured, resulting in that no abnormal current is flowed in the failure chip and a stable measurement can be carried out. In addition, in the case that the pre-test and the post-test are continuously carried out, the power supply voltage Vcc is applied automatically to the test pad 131 for the failure chip found at the measuring device during the pre-test operation, the post-test can be carried out while the failure chip is being removed automatically and electrically from the object to be measured.

Figure 5:
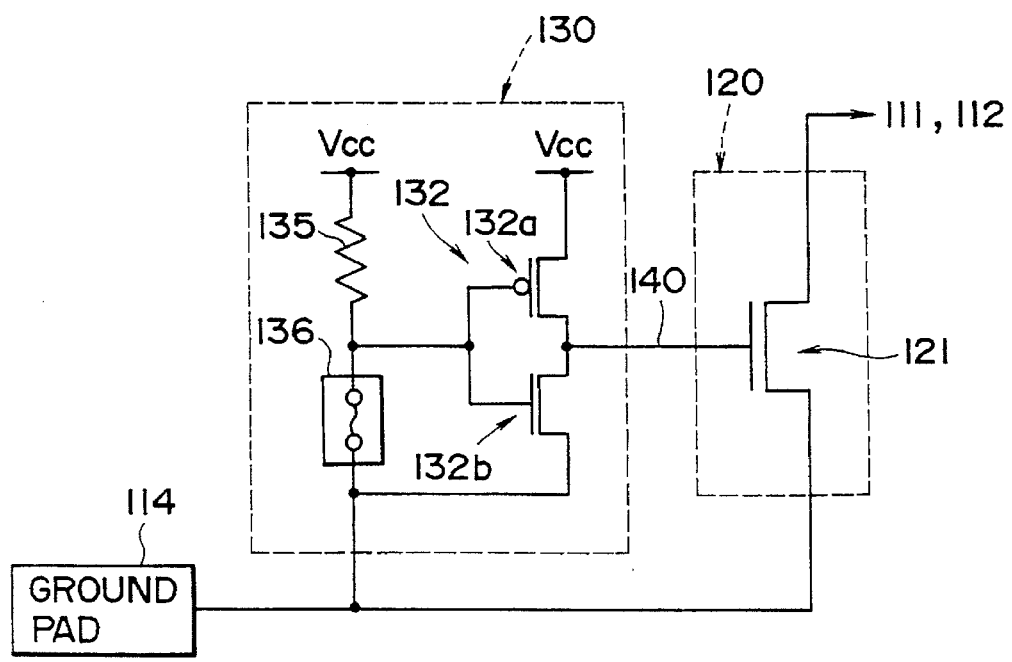
FIG. 5 is a circuit diagram for showing another configuration of the shut-off control circuit shown in FIG. 3.

FIG. 5 is a circuit diagram for showing another example of the configuration of the shut-off control circuit 130 shown in FIG. 3. In this example, the shut-off control circuit 130 is comprised of a resistor 135, a laser fuse 136 and an inverter 132. The power supply voltage Vcc is applied to one end of the resistor 135. The other end of the resistor 135 is connected to one end of the laser fuse 136 and the other end of the laser fuse 136 is connected to a ground pad 114. A connecting point between the resistor 135 and the laser fuse 136 is connected to an input terminal of the inverter 132. An output terminal of the inverter 132 is connected to a gate of the nMOS 121.

In the shut-off control circuit 130 shown in FIG. 5, the laser fuse 136 is not melted cut at the beginning in operation. Accordingly, during the testing operation, since a ground level is applied to the input terminal of the inverter 132, the shut-off control signal 140 from the shut-off control circuit 130 becomes "H" level, resulting in that the current supply circuit 120 becomes conductive. In turn, in the case that post-test is carried out while the failure chip is being electrically removed from the object to be measured, the laser fuse 136 in the failure chip is melted cut with a laser beam before performing the post-test. In this way, since "E" level is applied to the input terminal of the inverter 132, the shut-off control signal 140 obtained from the shut-off control circuit 130 becomes "L" level, resulting in that the current supply circuit 120 becomes a state to shut off the current.

The present invention is not limited to the aforesaid preferred embodiments and the conductive shut-off selection means is not limited to the configuration of the current supply circuit 120 and the shut-off control circuit 130 shown in the preferred embodiment, and it may be applicable that the depression type pMOS may be used as the current supply circuit 120, the power supply voltage is applied to its gate from an external part to make a shut-off state, for example. In addition, the present invention is not limited to SRAM, but it may be applicable to other semiconductor elements such as DRAM (a dynamic RAM) and the like.

What is claimed is:

1. A semiconductor memory comprising:

a memory cell array having a plurality of memory cells for storing data;

input-output means for inputting or outputting data;

test data generation means for generating a predetermined data during a testing operation;

a writing and reading-out control means for performing a writing of data inputted by said input-output means into a memory cell or reading-out data from the memory cell during a normal state and for performing writing of test data generated by said test data generation means or reading-out data from the memory cell during a testing operation;

address generation means for generating an address of the memory cell in response to a clock signal obtained from an external part during the testing operation;

address specifying means for specifying an address of the memory cell for performing a data writing or data reading-out operation by said writing and reading-out control means in response to the address signal from an external part during a normal state, and for specifying an address of the memory cell for writing or reading-out the data by said writing and reading-out control means in response to the address generated by said address generation means during the testing operation;

discriminator means for comparing the test data generated by said test data generation means with data read out of the memory cell having the test data written into it during the testing operation, discriminating whether or not the writing and the reading-out are normal and outputting a discrimination result to an external part; and a test operation selecting means for operating said test data generation means, the address generation means and the discriminating means in response to a control signal obtained from an external part during the testing operation.

2. A semiconductor memory comprising:

a memory cell array having a plurality of memory cells for storing data of a unit of a plurality of bits;

input-output means for inputting or outputting data of a unit of a plurality of bits;

test data generation means capable of generating a plurality of patterns of test data of a plurality of bits during a testing operation;

pattern selection means for selecting the test data pattern generated by said test data generation means in response to a pattern selection signal obtained from an external part during a testing operation;

a writing and reading-out control means for performing a writing of data inputted by said input-output means into a memory cell or reading-out data from the memory cell during a normal state and for performing writing of test data generated by said test data generation means or reading-out data from the memory cell during a testing operation;

address generation means for generating address of the memory cell in response to a clock signal obtained from an external part during the testing operation;

address specifying means for specifying an address of the memory cell for performing a data writing or data reading-out operation by said writing and reading-out control means in response to the address signal from an external part during a normal state, and for specifying an address of the memory cell for writing or reading-out the data by said writing and reading-out control means in response to the address generated by said address generation means during the testing operation;

discriminator means for comparing the test data generated by said test data generation means with data read out of the memory cell having the test data written into it during the testing operation, discriminating whether or not the writing and the reading-out are normal and outputting a discrimination result to an external part; and a test operation selecting means for operating said test data generation means, the pattern selecting means, the address generation means and the discriminating means in response to a control signal obtained from an external part during the testing operation.

3. A semiconductor memory as set forth in claims 1 and 2 comprising:

a function circuit part;

a terminal for supplying a current to said function circuit part; and an electrical conduction shut-off selection means capable of selecting a conduction and a shut-off of current supplied to said function circuit part through said terminal.

4. A semiconductor memory as set forth in claim 3, an improvement in which said conduction and shut-off selection means has an input terminal for inputting a signal obtained from an external part and selects conduction and shut-off in response to a signal inputted from said input terminal.

\* \* \* \* \*

UNITED STATES PATENT AND TRADEMARK OFFICE
CERTIFICATE OF CORRECTION

PATENT NO.   : 5,661,729
DATED        : August 26, 1997
INVENTOR(S)  : Jyunzo Miyazaki et al.

It is certified that error appears in the above-identified patent and that said Letters Patent is hereby corrected as shown below:

<u>Title page,</u>
Item [73], Assignee: Sony Corporation. Japan.
Item [21], Application No. 08/636,524

Signed and Sealed this

Sixteenth Day of July, 2002

*Attest:*

*Attesting Officer*

JAMES E. ROGAN
*Director of the United States Patent and Trademark Office*